United States Patent
Kim et al.

(10) Patent No.: US 9,105,611 B2
(45) Date of Patent: Aug. 11, 2015

(54) POWER MODULE PACKAGE

(75) Inventors: Kwang Soo Kim, Gyunggi-do (KR); Yong Hoon Kwak, Gyunggi-do (KR); Sun Woo Yun, Gyunggi-do (KR); Young Ki Lee, Gyunggi-do (KR); Kyu Hwan Oh, Gyunggi-do (KR); Jin Suk Son, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/610,671

(22) Filed: Sep. 11, 2012

(65) Prior Publication Data

US 2013/0105953 A1    May 2, 2013

(30) Foreign Application Priority Data

Oct. 31, 2011 (KR) .................. 10-2011-0112335

(51) Int. Cl.
*H01L 23/495* (2006.01)
*H01L 23/433* (2006.01)

(52) U.S. Cl.
CPC ...... *H01L 23/4334* (2013.01); *H01L 23/49531* (2013.01); *H01L 23/49537* (2013.01); *H01L 23/49575* (2013.01); *H01L 2224/48137* (2013.01); *H01L 2224/48247* (2013.01); *H01L 2924/1305* (2013.01); *H01L 2924/13034* (2013.01); *H01L 2924/13055* (2013.01); *H01L 2924/13091* (2013.01)

(58) Field of Classification Search
CPC ................. H01L 23/49503; H01L 23/49582

USPC ........... 257/666, 703, 706, 713, 723, E23.101
See application file for complete search history.

(56) References Cited

U.S. PATENT DOCUMENTS

| | | | | |
|---|---|---|---|---|
| 5,365,409 A | * | 11/1994 | Kwon et al. | 361/813 |
| 5,386,141 A | * | 1/1995 | Liang et al. | 257/676 |
| 6,603,072 B1 | * | 8/2003 | Foster et al. | 174/536 |
| 6,700,210 B1 | * | 3/2004 | Smith | 257/790 |
| 6,972,479 B2 | * | 12/2005 | Chen et al. | 257/666 |
| 7,411,278 B2 | * | 8/2008 | Wen et al. | 257/659 |
| 2005/0205970 A1 | * | 9/2005 | Chen et al. | 257/666 |
| 2009/0206456 A1 | * | 8/2009 | Guth et al. | 257/666 |

FOREIGN PATENT DOCUMENTS

| | | |
|---|---|---|
| JP | 09-129822 | 5/1997 |
| JP | 2010-129795 | 6/2010 |
| KR | 10-2009-0104478 | 10/2009 |

OTHER PUBLICATIONS

Office Action dated Apr. 1, 2013 for related Korean Patent Application No. 10-2011-0112335 and its English summary provided by the clients.

* cited by examiner

*Primary Examiner* — Nitin Parekh

(74) *Attorney, Agent, or Firm* — Ladas & Parry, LLP

(57) ABSTRACT

Disclosed herein is a power module package including: a substrate having a ceramic layer formed in one surface thereof; a circuit pattern formed on the ceramic layer; a first lead frame having one side contacting the circuit pattern and the other side protruding toward the outside; and a first semiconductor chip mounted on one side of the first lead frame.

6 Claims, 2 Drawing Sheets

POWER MODULE PACKAGE

CROSS REFERENCE TO RELATED APPLICATION

This application claims the benefit of Korean Patent Application No. 10-2011-0112335, filed on Oct. 31, 2011, entitled "Power Module Package", which is hereby incorporated by reference in its entirety into this application.

BACKGROUND OF THE INVENTION

1. Technical Field

The present invention relates to a power module package.

2. Description of the Related Art

As an amount of used energy increases worldwide, a power conversion apparatus such as an inverter for home and industry has been increasingly employed for an efficient use of energy and protection of an environment.

An intelligent power module (IPM) spotlighting along with an increase in the employment of the inverter is a core parts performing functions of rectifying a DC and converting an AC and may be applied to home appliances such as a refrigerator, a washing machine, an air conditioner, etc., industrial appliances such as an industrial motor, and next generation appliances such as HEV, EV, etc.

In general, if heat is greatly generated during a power conversion process, and the generated heat is not efficiently removed, a module and a whole system may deteriorate in terms of performance and be damaged. Furthermore, since multi-function and small-size parts are essential to the IPM according to a recent tendency, an efficient dissipation of heat due to the multi-function and small-size parts is also an important factor as well as a structure enhancement for multi-function and small-size.

Meanwhile, as one of conventional methods, a direct bonded copper (DBC) substrate obtained by sintering and bonding a copper substrate to both sides with respect to ceramic by applying heat and pressure is used.

However, the above-described DBC substrate has advantageously excellent heat dissipation and thermal conductivity characteristics, whereas it is disadvantageously expensive in terms of a processing characteristic, and it is difficult to manufacture a large size DBC substrate in terms of a thin ceramic characteristic.

Furthermore, the above-described DBC substrate has a structure in which the copper substrates are bonded to both sides of the ceramic, which may problematically cause delamination of the copper substrate from the ceramic.

SUMMARY OF THE INVENTION

The present invention has been made in an effort to provide a power module package having an improved heat dissipation characteristic.

Further, the present invention has been made in an effort to provide a power module package capable of minimizing an influence of heat generated from a power device to a control device.

Further, the present invention has been made in an effort to provide a power module package having reduced material cost and processing expense.

Further, the present invention has been made in an effort to provide a power module package capable of preventing delamination from occurring between metal layers.

According to a first preferred embodiment of the present invention, there is provided a power module package, including: a substrate having a ceramic layer formed in one surface thereof; a circuit pattern formed on the ceramic layer; a first lead frame having one side contacting the circuit pattern and the other side protruding toward the outside; and a first semiconductor chip mounted on one side of the first lead frame.

The power module package may further include: a bonding layer formed between the circuit pattern and the first lead frame.

The circuit pattern may include an electroless plating layer and an electroplating layer.

The power module package may further include: a second lead frame spaced apart from the first lead frame and electrically connected to the first semiconductor chip; and a second semiconductor chip mounted on the second lead frame.

The first lead frame and the second lead frame may be formed to have a step therebetween.

The power module package may further include: a molding material formed to surround the first semiconductor chip from a side of the substrate.

The substrate may be a metal substrate.

According to a second preferred embodiment of the present invention, there is provided a power module package including: a substrate having a ceramic layer formed in one surface thereof; a circuit pattern formed on the ceramic layer; and a lead frame bonded onto the circuit pattern.

The lead frame may include a first lead frame having one side contacting the circuit pattern and the other side protruding toward the outside and a second lead frame having one side contacting the circuit pattern and the other side protruding toward the outside, wherein one side of the first lead frame and one side of the second lead frame are spaced apart to face each other.

The power module package may further include: a first semiconductor chip mounted on the first lead frame; and a second semiconductor chip mounted on the second lead frame.

The power module package may further include: a first semiconductor chip mounted on the first lead frame; and a second semiconductor chip mounted on the circuit pattern.

The power module package may further include: a first semiconductor chip and a second semiconductor chip mounted on the circuit pattern, wherein the circuit pattern on which the first semiconductor chip is mounted and the circuit pattern on which the second semiconductor chip is mounted are spaced apart from each other.

The power module package may further include: a bonding layer formed between the circuit pattern and the lead frame.

The circuit pattern may include an electroless plating layer and an electroplating layer.

The power module package may further include: a molding material formed to surround an upper portion of the lead frame from a side of the substrate.

The substrate may be a metal substrate.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
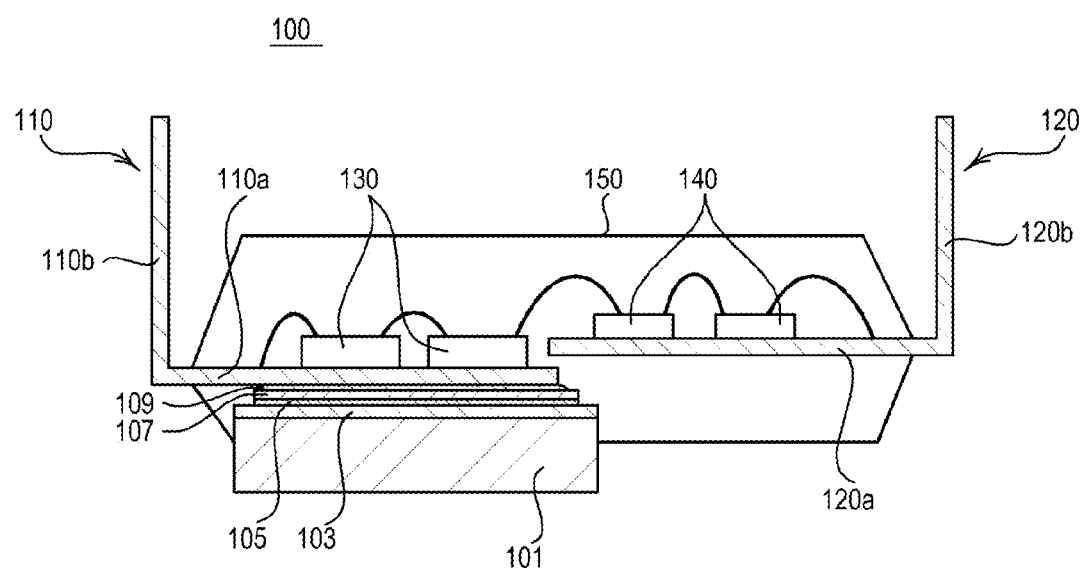
FIG. 1 is a cross-sectional view of a structure of a power module package according to a first embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

First Embodiment

FIG. 1 is a cross-sectional view of a structure of a power module package 100 according to a first embodiment of the present invention.

Referring to FIG. 1, the power module package 100 of the present embodiment includes a substrate 101 having a ceramic layer 103 formed in one surface thereof and a circuit pattern formed on the ceramic layer 103.

Also, in the present embodiment, the power module package 100 may further include a first lead frame 110 contacting the circuit pattern and a second lead frame 120 spaced apart from the first lead frame 110.

Also, in the present embodiment, the power module package 100 may further include a first semiconductor chip 130 mounted on the first lead frame 110 and a second semiconductor chip 140 mounted on the second lead frame 120.

Although the substrate 101 may be a metal substrate in the present embodiment, the present invention is not limited thereto. For example, the substrate 101 may include a printed circuit board (PCB), an insulated metal substrate (IMS), a pre-molded substrate.

In the present embodiment, the ceramic layer 103 may be formed in one surface of the substrate 101.

In this regard, the ceramic layer 103 may be formed through a spray process, a dipping process, a bar coating process, a spin coating process, etc. However, the present invention is not particularly limited thereto.

In this regard, since it is easy to form ceramic having a desired thickness according to the ceramic characteristics, the ceramic layer 103 having various thicknesses from 1 μm and 500 μm may be formed according to usage thereof.

Further, roughness is formed on the surface of the substrate 181 before forming the ceramic layer 103, thereby enhancing a bonding force between the ceramic layer 103 and the substrate 101.

In this regard, the roughness may be formed using a sand blast, plasma processing, wet surface processing, a brush buff, etc., but the present invention is not particularly limited thereto.

Also, in the present embodiment, a circuit pattern may be formed on the ceramic layer 103.

In this regard, as shown in FIG. 1, the circuit pattern may include an electroless plating layer 105 and an electroplating layer 107.

Further, the circuit pattern may be a metal layer pattern including copper (Cu) or copper alloy. In this case, copper (Cu) may provide excellent electric conductivity, and a nickel (Ni) layer for antioxide may be further formed on a copper circuit pattern.

Further, since the nickel (Ni) layer does not exhibit excellent coating property with respect to copper (Cu) and thus may also be oxidized, a metal (Au) layer may be further formed on the nickel (Ni) layer.

However, the circuit pattern is not limited to the structure of the present embodiment, and may include metal or metal alloy having excellent electric conductivity. For example, the circuit pattern may include aluminum or aluminum alloy.

In the present embodiment, an operation of forming the circuit pattern is as follows.

First, the seed layer 105 that is an electroless plating layer is formed on the ceramic layer 103 formed in one surface of the substrate 101.

In this regard, the seed layer 105 may be formed by a wet plating process or a dry plating process. In this regard, the wet plating process may be an electroless plating process, the dry plating process may be a sputtering process, but the present invention is not particularly limited thereto.

In this regard, the electroless plating process may be performed by using one of nickel (Ni), copper (Cu), and silver (Ag), and the sputtering process may be performed by using one of titanium (Ti), chrome (Cr), and nickel (Ni), but the present invention is not particularly limited thereto.

Next, the plating layer 107 that is an electroplating layer is formed on the seed layer 105.

In this regard, the plating layer 107 may also be formed by using the electroplating process or the sputtering process, and may be formed of copper (Cu), but the present invention is not particularly limited thereto. The plating layer 107 is formed of copper (Cu) exhibiting good solder bonding property since the plating layer 107 is bonded onto the first lead frame 110 by soldering at a subsequent process.

Next, an etching resist having an opening unit for forming a circuit pattern is formed on the plating layer 107, an etching process is performed, and the plating layer 107 and the seed layer 105 exposed by the opening unit for forming the circuit pattern are removed, and thus the circuit pattern may be formed.

Although a substractive technique is described as a process of forming the circuit pattern in the present embodiment, the present invention is not limited thereto, and all processes for forming a circuit pattern generally used in a PCB field may be applied.

In the present embodiment, one side 110a of the first lead frame 110 is bonded onto the plating layer 107 of the circuit pattern formed on the ceramic layer 103, and the other side 110b thereof may externally protrude form the substrate 101.

At this time, a bonding layer 109 may be further formed between the one side 110a of the first lead frame 110 and the plating layer 107 of the circuit pattern.

In this regard, the bonding layer 109 may be soldering, and may be used to connect mechanically and electrically the one side 110a of the first lead frame 110 and the plating layer 107 to each other.

Further, in the present embodiment, the second lead frame 120 may not contact the substrate 101 but may be spaced apart from the first lead frame 110. In this regard, the second lead frame 120 may be formed to have a step from the first lead frame 110. Although one side 120a of the second lead frame 120 may be formed to overlap the one side 110a of the first lead frame 110 in FIG. 1, this is merely an example, and the one side 120a of the second lead frame 120 may be formed not to overlap the one side 110a of the first lead frame 110.

Further, although a pair of lead frames 110 and 120 is shown in FIG. 1, this is merely a cross-sectional view, and it will be obvious that several pairs of lead frames may be formed.

As described above, a ceramic layer having excellent characteristics of heat dissipation is formed on one surface of a metal substrate, a circuit pattern of a minimum thickness is formed on the ceramic layer, and a lead frame is bonded onto the circuit pattern, and thus the lead frame functions as a heat dissipation substrate, thereby reducing manufacturing cost of the heat dissipation substrate and simultaneously enhancing the characteristics of heat dissipation.

In the present embodiment, as shown in FIG. 1, power module package 100 may further include a first semiconductor chip 130 mounted on the first lead frame 110 and a second semiconductor chip 140 mounted on the second lead frame 120.

Although not shown in FIG. 1, the first semiconductor chips 130 and the second semiconductor chip 140 may be bonded onto the first lead frame 110 and the second lead frame 120, respectively, by using a bonding member (not shown). The bonding adhesive (not shown) may be conductive or non-conductive.

For example, the bonding adhesive (not shown) may be formed by gold plating or may be a conductive paste or a conductive tape. Further, the bonding adhesive (not shown) may be a solder, metal epoxy, a metal paste, resin-based epoxy, or a bonding tape having excellent heat resistance.

For example, the bonding tape that may be used as the bonding adhesive (not shown) may be a high temperature tape such as a commercialized well-known glass tape, a silicon tape, a Teflon tape, a stainless foil tape, and a ceramic tape. The bonding adhesive (not shown) may be formed of a combination of the above materials, but the present invention is not particularly limited thereto.

In this regard, the first semiconductor chips 130 may use a silicon controlled rectifier (SCR), a power transistor, an insulated gate bipolar transistor (IGBT), a Morse transistor, a power rectifier, a power regulator, an inverter, a converter, or a high power semiconductor chip of a combination of theses or diode.

Further, the second semiconductor chip 140 may include a low power semiconductor chip for controlling the high power semiconductor chip, for example, a control device for controlling a power device.

In the present embodiment, the first semiconductor chip 130 and the second semiconductor chip 140 respectively bonded onto the first lead frame 110 and the second lead frame 120 may be electrically connected to the first lead frame 110 and the second lead frame 120 respectively through wire bonding using a wire 150.

In this regard, a wire bonding process may be preformed through ball bonding, wedge bonding, and stitch bonding that are well-known in the art to which the present invention pertains, but the present invention is not particularly limited thereto.

Meanwhile, although the first semiconductor chip 130 mounted on the first lead frame 110 and the second semiconductor chip 140 mounted on the second lead frame 120 are wire-bonded to the same lead frame in FIG. 1, this is merely a cross-sectional view, and it will be obvious that each semiconductor chip may be wire-bonded to different lead frames.

Further, in the present embodiment, as shown in FIG. 1, the power module package 100 may further include a molding material 150 formed to surround the first semiconductor chip 130 mounted on the first lead frame 110 and the second semiconductor chip 140 mounted on the second lead frame 120 that are bonded on the substrate 101, as an example from a side of the substrate 101 to a top portion thereof.

The molding material 150 includes a wire and protects the first semiconductor chip 130 and the second semiconductor chip 140 from an external environment and may use, for example, an epoxy molding compound (EMC), etc., but the present invention is not particularly limited thereto.

In this regard, although the molding material 150 is formed from a center portion of the side of the substrate 101 to the top portion thereof in FIG. 1, this is merely an example and the present invention is not particularly limited thereto. The molding material 150 may be formed in the whole side of the substrate 101.

Further, a heat sink may be attached to a bottom surface of the substrate 101 so as to improve the heat dissipation characteristic.

The power module package 100 according to the present embodiment applies a substrate in which a ceramic layer is formed to a power unit, and thus heat generated from the power unit does not influence to a control unit but may be directly discharged to the heat sink, thereby improving the heat dissipation characteristic and simultaneously maximizing a thermal separation.

Furthermore, the control unit and the power unit are designed to have a step, thereby minimizing a thermal transfer effect by a molding material.

Second Embodiment

Figure 2:
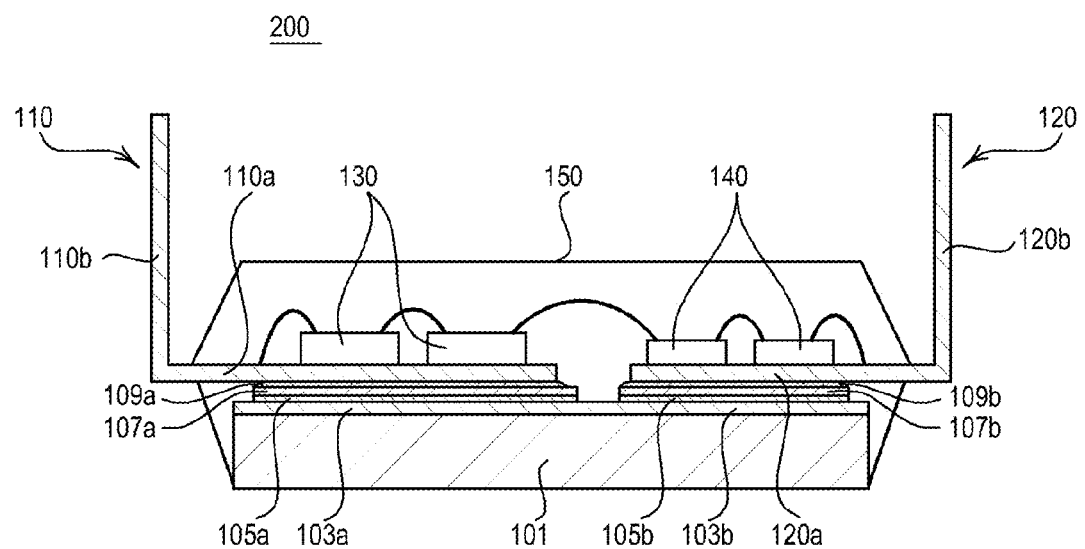
FIG. 2 is a cross-sectional view of a structure of a power module package according to a second embodiment of the present invention.

FIG. 2 is a cross-sectional view of a structure of a power module package 200 according to a second embodiment of the present invention.

Redundant descriptions between the first embodiment and the second embodiment will be omitted here, and the same reference numerals will denote the same elements therebetween.

Referring to FIG. 2, the power module package 200 according to the present embodiment has a structure in which both the first lead frame 110 and the second lead frame 120 are bonded onto the substrate 101.

That is, one side of the first lead frame 110 contacts a plating layer 107a of a circuit pattern formed on the ceramic layer 103 formed on one surface of the substrate 101, and the other side thereof protrudes from the substrate 101 toward the outside.

Likewise, one side of the second lead frame 120 contacts a plating layer 107b of a circuit pattern formed on the ceramic layer 103 formed on one surface of the substrate 101, and the other side thereof protrudes from the substrate 101 toward the outside.

In this regard, one side of the first lead frame 110 and one side of the second lead frame 120 are spaced apart to face each other and bonded to the substrate 101, and the plating layers 107a and 107b of the circuit patterns contacting the first lead frame 110 and the second lead frame 120 are also spaced apart from each other on the ceramic layer 103.

Also, in the present embodiment, the power module package 200 may further include the first semiconductor chip 130 mounted on the first lead frame 110 and the second semiconductor chip 140 mounted on the second lead frame 120.

The power module package 200 according to the present embodiment forms a ceramic layer having excellent characteristics of heat dissipation on one surface of a metal substrate having excellent heat dissipation characteristic and thermal conductivity, forms a circuit pattern of a minimum thickness on the ceramic layer, and bonds a lead frame onto the circuit pattern, and thus the lead frame functions as a heat dissipation substrate, thereby reducing manufacturing cost of a heat dissipation substrate and simultaneously enhancing the characteristics of heat dissipation.

Third Embodiment

Figure 3:
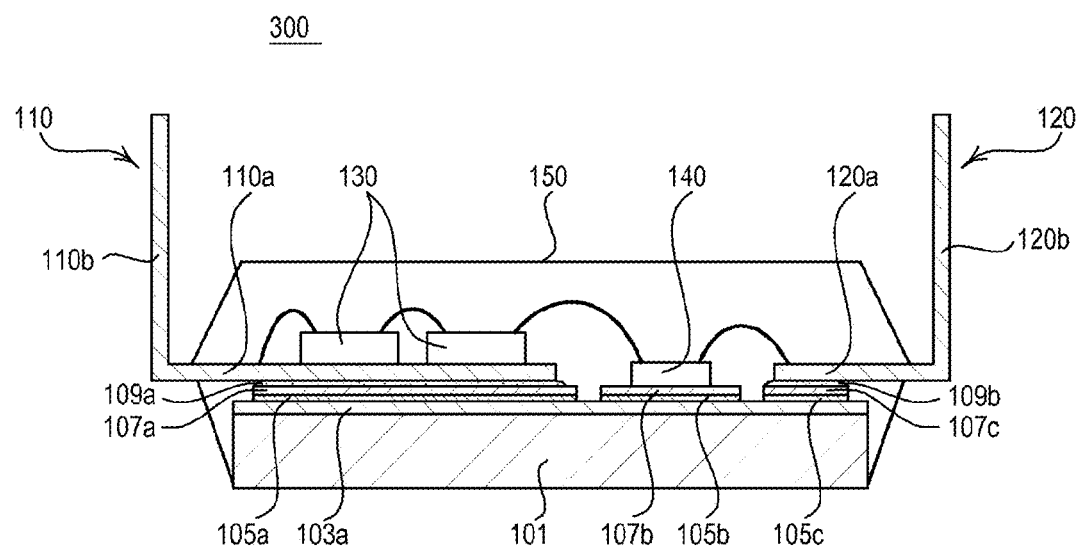
FIG. 3 is a cross-sectional view of a structure of a power module package according to a third embodiment of the present invention.

FIG. 3 is a cross-sectional view of a structure of a power module package 300 according to a second embodiment of the present invention.

Redundant descriptions between the first embodiment and the second embodiment will be omitted here, and the same reference numerals will denote the same elements therebetween.

Referring to FIG. 3, unlike the power module package 200 described according to the above-described second embodiment, the power module package 300 according to the present embodiment has a structure in which the first semiconductor chip 130 is mounted on the first lead frame 110, and the second semiconductor chip 140 is bonded onto the plating layer 107b of the circuit pattern formed on the ceramic layer 103 of the substrate 101.

The power module package 300 according to the present embodiment directly bonds the second semiconductor chip 140 that is a low power semiconductor chip for generating a relatively small amount of heat onto the plating layer 107b of the circuit pattern formed on the substrate 101, thereby reducing cost of the overall products by reducing uses of lead frames.

Fourth Embodiment

Figure 4:
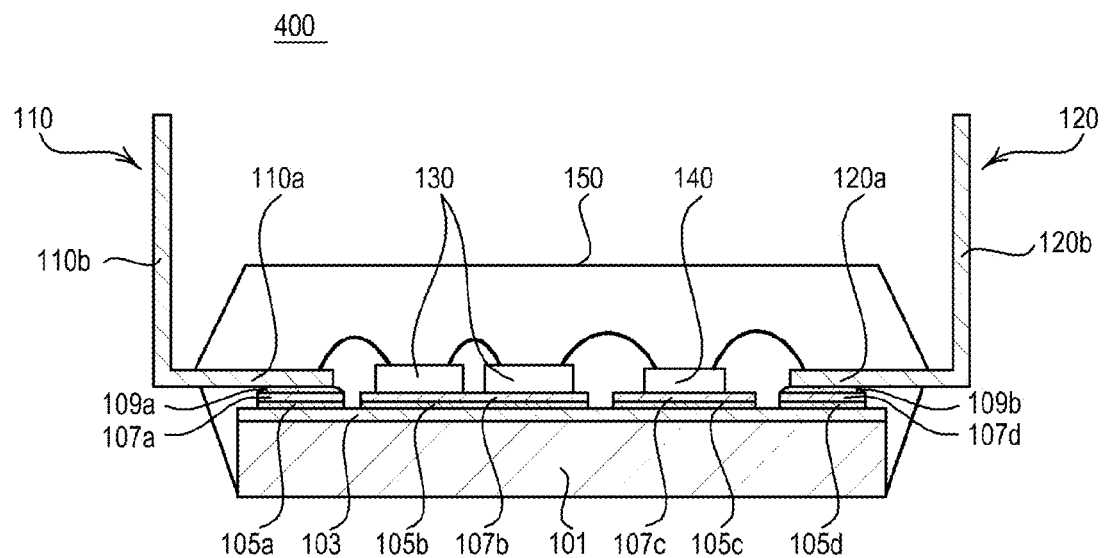
FIG. 4 is a cross-sectional view of a structure of a power module package according to a fourth embodiment of the present invention.

FIG. 4 is a cross-sectional view of a structure of a power module package 400 according to a second embodiment of the present invention.

Redundant descriptions between the first embodiment and the second embodiment will be omitted here, and the same reference numerals will denote the same elements therebetween.

Referring to FIG. 4, unlike the power module package 200 described according to the above-described second embodiment, the power module package 400 according to the present embodiment has a structure in which both the first semiconductor chip 130 and the second semiconductor chip 140 are bonded onto the plating layers 107b and 107c of the circuit pattern formed on the ceramic layer 103 of the substrate 101.

As described above, the first semiconductor chip 130 and the second semiconductor chip 140 are bonded onto the plating layers 107b and 107c of the circuit pattern formed on the ceramic layer 103 of the substrate 101, and thus the heat dissipation characteristic may be somewhat lower than that of the power module package 200 according to the second embodiment, whereas uses of lead frames are greatly reduced, thereby dramatically reducing cost of the overall products.

According to the present invention, a lead frame is bonded onto a meal substrate including a ceramic layer having excellent dissipation and insulation characteristics, and thus heat generated from a heating device mounted in the lead frame is dissipated using the lead frame and the metal substrate, thereby improving a dissipation characteristic.

Further, a power device and a control device are mounted to be thermally separated from each other, thereby minimizing an influence of heat generated from the power device to the control device.

Furthermore, the lead frame is bonded to the metal substrate in which a wire layer is formed through a plating process, which does not need using a thick copper foil, thereby preventing delamination from occurring due to stress between metal layers.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package, comprising:
a substrate having a ceramic layer having thickness from 1 micron to 500 microns and formed in one surface thereof;
a circuit pattern formed on the ceramic layer;
a first lead frame having one side contacting the circuit pattern and the other side protruding toward the outside;
a first semiconductor chip which is a power device and mounted on one side of the first lead frame;
a second lead frame spaced apart from the first lead frame and electrically connected to the first semiconductor chip; and
a second semiconductor chip which is a control device and mounted on the second lead frame,
wherein the substrate is one selected from the group consisting of a metal substrate, a printed circuit board, an insulated metal substrate and a pre-molded substrate and combinations thereof, and
wherein the substrate and the circuit pattern are formed only under the first lead frame, and the ceramic layer is not sintered using a direct bonded copper substrate.

2. The power module package as set forth in claim 1, further comprising:
a bonding layer formed between the circuit pattern and the first lead frame.

3. The power module package as set forth in claim 1, wherein the circuit pattern includes an electroless plating layer and an electroplating layer.

4. The power module package as set forth in claim 1, wherein the first lead frame and the second lead frame are formed to have a step therebetween.

5. The power module package as set forth in claim 1, further comprising:
a molding material formed to surround the first semiconductor chip from a side of the substrate.

6. The power module package as set forth in claim 1, wherein the substrate is a metal substrate.

\* \* \* \* \*